(12) United States Patent
Sun et al.

(10) Patent No.: US 12,298,351 B2
(45) Date of Patent: May 13, 2025

(54) CHARGE LEVEL EARLY WARNING METHOD FOR COMPOSITE BATTERY PACKS

(71) Applicant: EVE ENERGY CO., LTD., Guangdong (CN)

(72) Inventors: Peiling Sun, Guangdong (CN); Lang Cao, Guangdong (CN); Yuan Zhu, Guangdong (CN); Jianhua Liu, Guangdong (CN); Jincheng Liu, Guangdong (CN)

(73) Assignees: EVE ENERGY CO., LTD, Guangdong (CN); EVE HYPERPOWER BATTERIES INC., Guangdong (CN)

( * ) Notice: Subject to any disclaimer, the term of this patent is extended or adjusted under 35 U.S.C. 154(b) by 0 days.

(21) Appl. No.: 18/024,713

(22) PCT Filed: Nov. 20, 2020

(86) PCT No.: PCT/CN2020/130276
§ 371 (c)(1),
(2) Date: Mar. 3, 2023

(87) PCT Pub. No.: WO2022/062143
PCT Pub. Date: Mar. 31, 2022

(65) Prior Publication Data
US 2024/0280640 A1  Aug. 22, 2024

(30) Foreign Application Priority Data
Sep. 25, 2020 (CN) .......................... 202011027627.8

(51) Int. Cl.
*G01R 31/3842* (2019.01)

(52) U.S. Cl.
CPC .............. *G01R 31/3842* (2019.01)

(58) Field of Classification Search
None
See application file for complete search history.

(56) References Cited

U.S. PATENT DOCUMENTS

2021/0239765 A1* 8/2021 Katori .................. G01R 31/386

FOREIGN PATENT DOCUMENTS

| CN | 103592605 A | 2/2014 |
| CN | 104656024 A | 5/2015 |

(Continued)

OTHER PUBLICATIONS

International Search Report dated Jun. 24, 2021 issued in PCT/CN2020/130276.

(Continued)

*Primary Examiner* — Jas A Sanghera
(74) *Attorney, Agent, or Firm* — HUNTON ANDREWS KURTH LLP

(57) ABSTRACT

The present application provides a charge level early warning method for composite battery packs, comprising: performing voltage test and/or current test on at least two groups of composite battery packs formed by connecting lithium-thionyl chloride batteries and capacitors in parallel, wherein the voltage test is used for obtaining the correlation between the state of charge of the lithium-thionyl chloride batteries and stable voltages, and the current test is used for obtaining the correlation between the state of charge of the lithium-thionyl chloride batteries and the maximum output current; and monitoring the composite battery packs on which charge level early warning is to be performed, and performing early warning according to a voltage, and/or performing early warning according to a current.

25 Claims, 1 Drawing Sheet

(56) References Cited

FOREIGN PATENT DOCUMENTS

| CN | 105974328 A | 9/2016 |
|---|---|---|
| CN | 108957333 A | 12/2018 |
| CN | 109075402 A | 12/2018 |
| CN | 109471036 A | 3/2019 |
| CN | 110912220 A | 3/2020 |
| CN | 111123127 A | 5/2020 |
| CN | 111624505 A | 9/2020 |
| JP | H08194021 A | 7/1996 |
| WO | 2019020780 A1 | 1/2019 |

OTHER PUBLICATIONS

Frankforter, Kevin J. et al., Investigation of hybrid Battery/Ultracapacito Electrode Customization for Energy Storage Applications With different Energy and Power Requirements using HPPC Cycling, IEEE Transactions on Industry Applications, vol. 56, No. 2, p. 1714-1728, Mar./Apr. 2020.

First Office Action issued May 14, 2021 on in CN202011027627.8.

Prediction of residual capacity of Lithium subbattery in smart water meter, China Academic Journal Electronic Publishing House, [From the Internet] http://www.cnki.net, No. 02, 2020, [English langauge translation enclosed].

\* cited by examiner

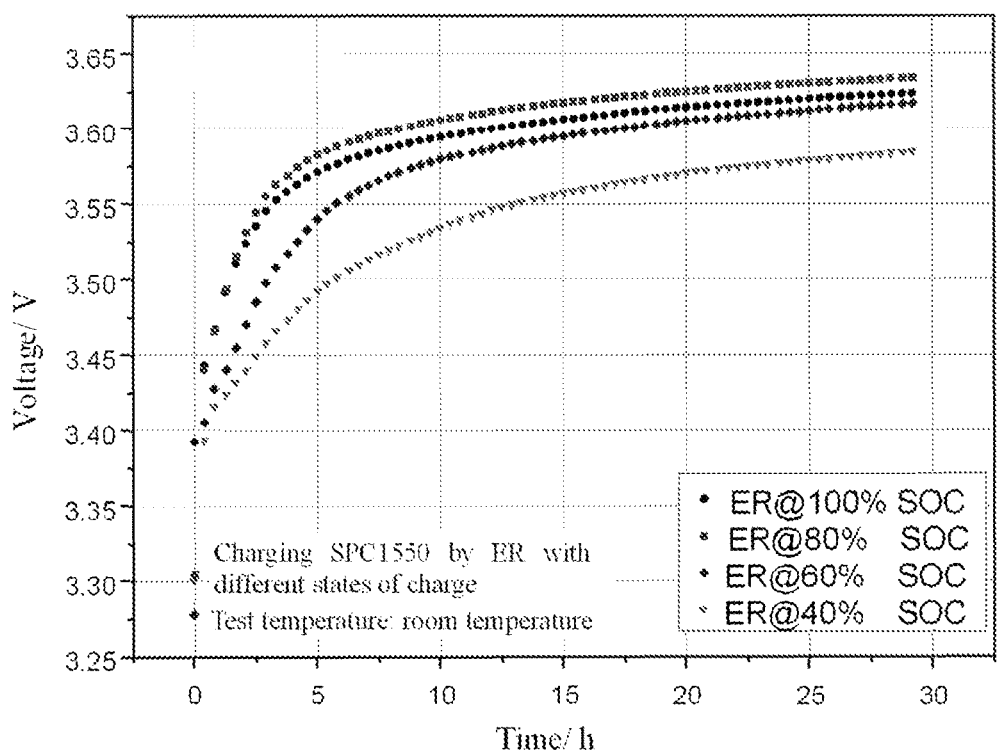

CHARGE LEVEL EARLY WARNING METHOD FOR COMPOSITE BATTERY PACKS

TECHNICAL FIELD

The present application belongs to the technical field of batteries and relates to a method of charge level early warning for a composite battery pack.

BACKGROUND

With the development of Internet of Things technology, it has been widely used in smart manufacturing, smart logistics, smart transportation, smart energy, smart healthcare, smart home, smart agriculture, smart retail, smart security and smart building. All Internet of Things nodes have one thing in common: they need power to operate, which can be satisfied by energy collection (such as solar, vibration, RF and other methods) which, however, is limited by the operating environment of the sensors: or by using battery systems with low duty cycle, low sleep current, and proper pulse capability, in which the power supply solution based on the lithium thionyl chloride battery can meet the minimum 10 year life requirement with a very low self-discharge rate per year. Meanwhile, relying on the high power and strong pulse output capability of lithium-ion capacitors, the composite power supply of lithium thionyl chloride battery+ lithium-ion battery capacitor can be applied to various sensors in Internet of Things applications and different wireless communication modes. For equipment manufacturers and end users, by estimating the battery remaining capacity and performing low charge level early warning, the equipment can be managed and controlled properly and effectively and the user satisfaction can be improved. The remaining capacity of the composite power supply of lithium thionyl chloride battery+lithium-ion battery capacitor depends on the lithium thionyl chloride battery. However, the discharge curve of the lithium thionyl chloride battery is very smooth and the voltage does not drop significantly until the power is depleted. Thus, the remaining capacity cannot be estimated just based on the voltage change of the lithium thionyl chloride battery, and there is difficulty in low charge level early warning.

Currently, there are two main methods for estimating the remaining capacity of lithium thionyl chloride batteries. One estimation method is to measure the battery internal resistance and then indirectly obtain the battery capacity through equation calculation: in this method, the variation of the internal resistance is related to different battery models, the service environment of the battery and the discharge rate for capacity consumption, and these factors will affect the accuracy of the estimation. Another estimation method is to measure the battery pulse discharge current and indirectly obtain the battery capacity through equation calculation. The battery discharge capability is related to the electrode surface state, maximum reaction area, activation density and other factors. The minimum pulse voltage represents the maximum discharge capability of the battery at a certain moment and is intrinsically related to the remaining capacity of the battery; and thus the remaining capacity of lithium thionyl chloride battery can be indirectly estimated based on the variation of pulse voltage. The variation of pulse voltage at different discharge depths is measured, and then a mathematical model of pulse voltage and remaining capacity is established by data simulation to determine the remaining capacity of the battery. However, when plotting the pulse voltage-residual capacity curve, it is found during the model building process that this method can only establish the remaining capacity at a low temperature.

CN103592605A discloses a lithium thionyl chloride battery pack management system and method, and the management system includes a lithium thionyl chloride battery pack. The lithium thionyl chloride battery pack management system further includes: a current measurement unit, which measures a current signal and sends the measurement result to an analysis unit: an analysis unit, which collects the measurement result in a variable cycle and gives a current value, and the battery capacity loss can be obtained based on the current value. Specifically, the current signal of the circuit in which the lithium thionyl chloride battery pack is located is collected in a variable cycle, and the current value is obtained based on the collection result: the battery capacity loss is obtained based on the current value: an environment temperature of the lithium thionyl chloride battery pack is measured: a self-discharge rate of the lithium thionyl chloride battery pack is obtained based on the environment temperature and the remaining capacity of the battery is obtained based on a rated capacity of the battery, the self-discharge rate and the battery capacity loss: the battery pack is provided with current pulses periodically when in microcurrent operating mode to suppress the generation of battery voltage hysteresis. However, this solution has extremely tedious calculation, the practicality of its capacity early warning method is poor, and it cannot effectively solve the problem of low charge level early warning for the composite power supply of lithium thionyl chloride battery and lithium-ion battery capacitor.

SUMMARY

An object of the present application is to provide a method of charge level early warning for a composite battery pack. The method provided in the present application is simple and easy to implement without complicated calculations, which can be applied to Internet of Things smart devices.

To achieve the object, the present application adopts the technical solutions below:

The present application provides a method of charge level early warning for a composite battery pack, and the method includes the following steps:

performing a voltage test and/or a current test on at least two composite battery packs formed by connecting a lithium thionyl chloride battery with a capacitor in parallel: in which the lithium thionyl chloride battery in each composite battery pack has a different state of charge:

the voltage test includes measuring a stable voltage of the capacitor at a set test time interval, and based on the test result, obtaining a correlation between the state of charge of the lithium thionyl chloride battery and the stable voltage:

the current test includes measuring a maximum output current, and based on the test result, obtaining a correlation between the state of charge of the lithium thionyl chloride battery and the maximum output current:

monitoring a composite battery pack to be subjected to charge level early warning, and performing early warning based on voltage, in which the early warning is performed when the stable voltage of the capacitor in the composite battery pack to be subjected to charge level early warning is less than or equal to the stable voltage corresponding to a set state-of-charge early warning value of the lithium thionyl chloride battery, and/or performing early warning based on current, in which, under the same discharge condition as the current test, the early warning is performed when the maximum output current of the lithium thionyl chloride battery in the composite battery pack to be subjected to charge level early warning is less than or equal to the maximum output current corresponding to a set state-of-charge early warning value of the lithium thionyl chloride battery.

The number of the at least two composite battery packs formed by connecting a lithium thionyl chloride battery with a capacitor in parallel includes 2, 3, 4, 5, 6, 7, 8, 9 or 10, etc.

In the method provided in the present application, the maximum output current refers to the maximum output current which can be detected during the current test for a composite battery pack which is tested.

In the method provided in the present application, the correlation between the stable voltage and the remaining capacity of the lithium thionyl chloride battery is found by monitoring the stable voltage of the capacitor in the composite battery pack, and/or the correlation between the maximum charging current and the remaining capacity of the lithium thionyl chloride battery is found by detecting the maximum output current of the composite battery pack, and the early warning is performed simultaneously or separately, solving the problem of performing low charge level early warning for the composite power supply of the lithium thionyl chloride battery and capacitor.

The method provided in the present application is simple and easy to implement without complicated calculations, which can be applied to Internet of Things smart devices.

The working principle of the composite battery pack in the present application is that the lithium thionyl chloride battery serves as a power supply for charging the capacitor, and provides a small but stable current to the device at the same time, and the capacitor provides a large pulse current. The stable voltage of the lithium-ion battery capacitor depends on the charging capability of the lithium thionyl chloride battery, and the charging capability of the lithium thionyl chloride battery has an intrinsic relationship with its remaining capacity. When the state of charge of the lithium thionyl chloride battery is lower than 40%, the stable voltage of the capacitor will decrease significantly and the time needed for being charged to the stable voltage (i.e., charging time) will be prolonged. Accordingly, the present application establishes one of the low charge level early warning methods for the battery pack based on this characteristic. When the capacitor provides a large pulse current, there will be a large potential difference between the capacitor and the lithium thionyl chloride battery instantaneously, and the instantaneous charging current at this moment is correlated with the remaining capacity of the lithium thionyl chloride battery; and accordingly, the present application establishes one of the low charge level early warning methods for the battery pack based on this characteristic.

The following technical solutions are optional for the present application, but should not be regard as a limitation of the technical solutions provided in the present application. The technical purposes and beneficial effects of the present application can be better achieved and realized by the following technical solutions.

As an optional technical solution of the present application, the capacitor includes a conventional capacitor and/or a supercapacitor.

Optionally, the capacitor includes a lithium-ion battery capacitor. The lithium-ion battery capacitor belongs to the supercapacitor.

As an optional technical solution of the present application, the lithium thionyl chloride battery used for the tests has a state of charge of 20-100%, such as 20%, 30%, 40%, 50%, 60%, 70%, 80%, 90% or 100%, etc.

In the present application, the state of charge of the lithium thionyl chloride battery to be tested can be adjusted according to the set state-of-charge early warning.

As an optional technical solution of the present application, each of the composite battery packs used for the tests has the same capacitor, which can ensure that the test results are comparable with each other.

As an optional technical solution of the present application, the set test time interval is 1-3 h, such as 1 h, 1.5 h, 2 h, 2.5 h or 3 h, etc.

As an optional technical solution of the present application, the stable voltage is, in a case where two tests are performed on voltage at the set test time interval and a difference between a result from a latter test and a result from a former test is less than or equal to 1 mV, the voltage from the latter test. For example, the difference is 1 mV, 0.9 mV, 0.8 mV or 0.7 mV, etc.

Optionally, a method for obtaining the correlation between the state of charge of the lithium thionyl chloride battery and the stable voltage includes plotting based on data.

As an optional technical solution of the present application, the maximum output current is measured under a pulse discharge condition.

Optionally, the pulse discharge is performed at 200-400 mA/1 s, such as 200 mA/1 s, 250 mA/1 s, 300 mA/1 s, 350 mA/1 s or 400 mA/1 s, etc. The above pulse discharge adopted is closer to the actual application scenario and is conducive to better charge level early warning for the composite battery pack.

Optionally, the maximum output current is measured at two ends of the lithium thionyl chloride battery.

As an optional technical solution of the present application, the early warning is performed when the stable voltage of the capacitor in the composite battery pack to be subjected to charge level early warning is consecutively less than or equal to the stable voltage corresponding to the set state-of-charge early warning value of the lithium thionyl chloride battery for 10-14 h, such as 10 h, 11 h, 12 h, 13 h or 14 h, etc.

As an optional technical solution of the present application, for the early warning method, in a case where the voltage early warning and the current early warning are performed simultaneously, when either of the voltage early warning and the current early warning reaches its early warning condition, it is determined that the charge level of the composite battery pack reaches the early warning value.

As a further optional technical solution of the method in the present application, the method includes the following steps:

performing a voltage test and/or a current test on at least two composite battery packs formed by connecting a lithium thionyl chloride battery with a capacitor in parallel: in which the lithium thionyl chloride battery used for the tests has a state of charge of 20-100%, and the lithium thionyl chloride battery in each composite battery pack has a different state of charge: each of the composite battery packs used for the tests has the same capacitor;

the voltage test includes measuring a stable voltage of the capacitor at a test time interval of 1-3 h, and based on the test result, obtaining a correlation between the state of charge of the lithium thionyl chloride battery and the stable voltage;

the current test includes measuring a maximum output current at two ends of the lithium thionyl chloride battery under 200-400 mA/s pulse discharge condition, and based on the test result, obtaining a correlation between the state of charge of the lithium thionyl chloride battery and the maximum output current;

monitoring a composite battery pack to be subjected to charge level early warning, and performing early warning based on voltage, in which the early warning is performed when the stable voltage of the capacitor in the composite battery pack to be subjected to charge level early warning is less than or equal to the stable voltage corresponding to a set state-of-charge early warning value of the lithium thionyl chloride battery, and/or performing early warning based on current, in which, under the same pulse discharge condition as the current test, the early warning is performed when the maximum output current of the lithium thionyl chloride battery in the composite battery pack to be subjected to charge level early warning is less than or equal to the maximum output current corresponding to a set state-of-charge early warning value of the lithium thionyl chloride battery;

in a case where the voltage early warning and the current early warning are performed simultaneously, when either of the voltage early warning and the current early warning reaches its early warning condition, it is determined that the charge level of the composite battery pack reaches the early warning value.

Compared with the prior art, the present application has the following beneficial effects.

In the method provided in the present application, the correlation between the stable voltage and the remaining capacity of the lithium thionyl chloride battery is found by monitoring the stable voltage of the capacitor in the composite battery pack, and/or the correlation between the maximum charging current and the remaining capacity of the lithium thionyl chloride battery is found by detecting the maximum output current of the composite battery pack, and the early warning is performed simultaneously or separately, solving the problem of performing low charge level early warning for the composite power supply of the lithium thionyl chloride battery and capacitor. The method provided in the present application is simple and easy to implement without complicated calculations, which can be applied to Internet of Things smart devices.

BRIEF DESCRIPTION OF DRAWINGS

FIG. 1 shows charging curves of charging a capacitor with lithium thionyl chloride batteries with different states of charge provided in Example 4.

DETAILED DESCRIPTION

In order to better illustrate the present application and facilitate understanding of the technical solutions of the present application, the present application is further described in details hereafter. However, the following embodiments are only simple examples of the present application and do not represent or limit the protection scope of the present application, and the protection scope of the present application is subject to the claims.

The typical but not limiting examples of the present application are as follows.

Example 1

Charge level early warning for a composite battery pack is performed according to the following method in this example.

(1) Lithium thionyl chloride batteries (ER26500 battery) were discharged to different states of charge in a manner of 5 mA discharge mode, and ER26500 batteries with states of charge of 100%, 80%, 60%, 40%, 30%, 25% and 20% were selected.

(2) Each of the ER26500 batteries with different states of charge was connected with a lithium-ion battery capacitor in parallel to form a composite battery pack: the composite battery pack was operated in a power consumption mode of a typical smart water meter, where, in a day, data were uploaded every 1 h, a pulse current was 300 mA, an average current was 580 µA, data were stored every 30 min, an average current was 2100 µA, a stable voltage at two ends of the lithium-ion battery capacitor was monitored at room temperature and data were recorded every 2 h: the stable voltage refers to, in a case where two tests are performed at an interval of 2 h and a difference between a result from a latter test and a result from a former test is less than or equal to 1 mV, the voltage from the latter test.

(3) The monitored stable voltage at two ends of the lithium-ion battery capacitor was plotted to obtain a correlation between the state of charge of the lithium thionyl chloride battery and the stable voltage, the stable voltage corresponding to 20% capacity remained was found and used as an early warning voltage for low charge level, and when the stable voltage was lower than the early warning voltage in 12 consecutive hours, early warning was performed.

Example 2

Charge level early warning for a composite battery pack is performed according to the following method in this example.

(1) Lithium thionyl chloride batteries (ER26500 battery) were discharged to different states of charge in a manner of 5 mA discharge mode, and ER26500 batteries with states of charge of 100%, 80%, 60%, 40%, 30%, 25% and 20% were selected.

(2) Each of the ER26500 batteries with different states of charge was connected with a lithium-ion battery capacitor in parallel to form a composite battery pack: the composite battery pack was operated in a power consumption mode of a typical smart water meter, where, in a day, data were uploaded every 1 h, a pulse current was 300 mA, an average current was 580 µA, data were stored every 30 min, an average current was 2100 µA, an output current was monitored at room temperature when the data were upload, and a maximum output current was recorded.

(3) The monitored maximum output current values at two ends of the ER26500 batteries with different states of charge were compared, and the maximum output current corresponding to 20% capacity remained was found and used as an early warning current for low charge level.

Example 3

Charge level early warning for a composite battery pack is performed according to the following method in this example.

(1) Lithium thionyl chloride batteries (ER26500 battery) were discharged to different states of charge in a manner of 5 mA discharge mode, and ER26500 batteries with states of charge of 100%, 80%, 60%, 40%, 30%, 25% and 20% were selected.

(2) Each of the ER26500 batteries with different states of charge was connected with a lithium-ion battery capacitor in parallel to form a composite battery pack, a stable voltage at two ends of the lithium-ion battery capacitor was monitored at room temperature, and data were recorded every 1 h: the stable voltage refers to, in a case where two tests are performed at an interval of 1 h and a difference between a result from a latter test and a result from a former test is less than or equal to 1 mV, the voltage from the latter test: an output current of the ER26500 battery was monitored at room temperature under 200 mA/1 s pulse discharge condition, and a maximum output current was recorded.

(3) The monitored stable voltage at two ends of the lithium-ion battery capacitor was plotted to obtain a correlation between the state of charge of the lithium thionyl chloride battery and the stable voltage, the stable voltage corresponding to 20% capacity remained was found and used as an early warning voltage for low charge level, and when the stable voltage was lower than the early warning voltage in 10 consecutive hours, early warning was performed:

at the same time, the monitored maximum output current values at two ends of the ER26500 batteries with different states of charge were compared, and the maximum output current corresponding to 20% capacity remained was found and used as an early warning current for low charge level;

when either of the voltage early warning and the current early warning reaches its early warning condition, it is determined that the composite battery pack reaches a low charge level early warning value.

Example 4

Charge level early warning for a composite battery pack is performed according to the following method in this example.

(1) Lithium thionyl chloride batteries (ER26500 battery) were discharged to different states of charge in a manner of 5 mA discharge mode, and ER26500 batteries with states of charge of 100%, 80%, 60% and 40% were selected.

(2) Each of the ER26500 batteries with different states of charge was connected with a lithium-ion battery capacitor in parallel to form a composite battery pack, a stable voltage at two ends of the lithium-ion battery capacitor was monitored at room temperature, and data were recorded every 3 h: the stable voltage refers to, in a case where two tests are performed at an interval of 3 h and a difference between a result from a latter test and a result from a former test is less than or equal to 1 mV, the voltage from the latter test.

(3) The monitored stable voltage at two ends of the lithium-ion battery capacitor was plotted to obtain a correlation between the state of charge of the lithium thionyl chloride battery and the stable voltage, the stable voltage corresponding to 40% capacity remained was found and used as an early warning voltage for low charge level, and when the stable voltage was lower than the early warning voltage in 14 consecutive hours, early warning was performed.

FIG. 1 shows charging curves of charging the capacitor with the lithium thionyl chloride batteries with different states of charge in this example. It can be seen from this FIGURE that when the state of charge of the lithium thionyl chloride battery drops to 40%, the stable voltage decreases significantly to 3.583 V.

Comparative Example 1

With reference to the method in the example 1 of patent CN109696637A, this comparative example provides a capacity monitoring method for a disposable lithium battery, which includes a lithium battery, a filter capacitor, a current sampling precise resistor, a load circuit, an A/D voltage conversion circuit, and a firmware for calculating battery internal resistance and determining capacity. The lithium battery, filter capacitor and precise resistor are connected in series to form a main circuit, and a wire is arranged between the lithium battery and filter capacitor for grounding: the load circuit and filter capacitor are connected in parallel: the positive and negative ends of the precise resistor are connected to the positive and negative ends of the A/D voltage conversion circuit: the firmware for calculating battery internal resistance and determining capacity and the A/D voltage conversion circuit are connected in series.

The lithium battery is a disposable lithium battery, the disposable lithium battery is a lithium thionyl chloride battery, and the lithium thionyl chloride battery is an ER14250 lithium thionyl chloride battery.

The filter capacitor is a high-capacity supercapacitor with a capacity of 1.2 Farad.

The precise resistor is a current sampling precise resistor with a resistance value of one-tenth of the minimum internal resistance of the lithium battery.

The load circuit is loaded with a heat meter.

The capacity monitoring method for a disposable lithium battery requires measuring the output voltage and current of the battery twice while measuring the battery internal resistance. For the first time, the load starts with high power operation, and after a period of time, the battery charges the capacitor with a large charging current, at which time the A/D voltage conversion circuit is started, and voltages at two ends of the precise resistor is measured as $V_1$ and $V'_1$ using the A/D voltage conversion circuit, respectively, and then the battery-to-capacitor charging current can be obtained according to Equation (1):

$$I_1 = (V_1 - V'_1)/R \qquad (1)$$

For the second measurement, a state, where the whole machine is in standby mode and the capacitor is fully charged, is selected, and at this time, voltages at two ends of the resistor is measured as $V_2$ and $V'_2$, and then the current of the precise resistor can be obtained according to Equation (2):

$$I_2 = (V_2 - V'_2)/R \qquad (2)$$

Based on the current and voltage values obtained from Equation (1) and Equation (2) in the two measurements, the internal resistance of the battery can be calculated according to Equation (3):

$$r = (V_2 - V_1)/(I_1 - I_2) \qquad (3)$$

By establishing an accurate correlation curve of constant-current discharge voltage, capacity and internal resistance through laboratory measurements, the remaining capacity of ER14250 lithium thionyl chloride battery can be estimated after measuring the internal resistance of ER14250 lithium thionyl chloride battery, and early warning can be performed when the remaining capacity reaches the set threshold.

Combining the above examples and the comparative example, it can be seen that in the method provided by the examples, the correlation between the stable voltage and the remaining capacity of the lithium thionyl chloride battery is found by monitoring the stable voltage of the capacitor in the composite battery pack, and/or the correlation between the maximum charging current and the remaining capacity of the lithium thionyl chloride battery is found by detecting the maximum output current of the composite battery pack, and the early warning is performed simultaneously or separately, solving the problem of performing low charge level early warning for the composite power supply of the lithium thionyl chloride battery and capacitor. The method provided in the present application is simple and easy to implement without complicated calculations, which can be applied to Internet of Things smart devices.

The method of Comparative Example 1 can only estimate the capacity of the lithium thionyl chloride battery itself, which cannot be applied to the composite battery pack formed by connecting a lithium thionyl chloride battery with a capacitor in parallel. Besides, the method of Comparative Example 1 requires complex currents and tedious conversions, which is less practical.

The applicant has stated that although the detailed process equipment and process flow of the present application are illustrated through the above embodiments in the present application, the present application is not limited to the above detailed process equipment and process flow, which means that the present application is not necessarily rely on the above detailed process equipment and process flow to be implemented.

What is claimed is:

1. A method of charge level early warning for a composite battery pack, comprising the following steps:
    performing a voltage test and/or a current test on at least two composite battery packs formed by connecting a lithium thionyl chloride battery with a capacitor in parallel; wherein the lithium thionyl chloride battery in each composite battery pack has a different state of charge;
    the voltage test comprises measuring a stable voltage of the capacitor at a set test time interval, and based on the test result, obtaining a correlation between the state of charge of the lithium thionyl chloride battery and the stable voltage;
    the current test comprises measuring a maximum output current, and based on the test result, obtaining a correlation between the state of charge of the lithium thionyl chloride battery and the maximum output current;
    monitoring a composite battery pack to be subjected to charge level early warning, and performing early warning based on voltage, wherein the early warning is performed when the stable voltage of the capacitor in the composite battery pack to be subjected to charge level early warning is less than or equal to the stable voltage corresponding to a set state-of-charge early warning value of the lithium thionyl chloride battery, and/or
    performing early warning based on current, wherein, under the same discharge condition as the current test, the early warning is performed when the maximum output current of the lithium thionyl chloride battery in the composite battery pack to be subjected to charge level early warning is less than or equal to the maximum output current corresponding to a set state-of-charge early warning value of the lithium thionyl chloride battery.

2. The method of charge level early warning for a composite battery pack according to claim 1, wherein the set test time interval is 1-3 h.

3. The method of charge level early warning for a composite battery pack according to claim 2, wherein the stable voltage is, in a case where two tests are performed on voltage at the set test time interval and a difference between a result from a latter test and a result from a former test is less than or equal to 1 mV, the voltage from the latter test.

4. The method of charge level early warning for a composite battery pack according to claim 2, wherein the lithium thionyl chloride battery used for the tests has a state of charge of 20-100%.

5. The method of charge level early warning for a composite battery pack according to claim 2, wherein the maximum output current is measured under a pulse discharge condition;
    wherein the pulse discharge is performed at 200-400 mA/1 s; and
    the maximum output current is measured at two ends of the lithium thionyl chloride battery.

6. The method of charge level early warning for a composite battery pack according to claim 2, which further comprises plotting based on data to obtain the correlation between the state of charge of the lithium thionyl chloride battery and the maximum output current.

7. The method of charge level early warning for a composite battery pack according to claim 1, wherein the stable voltage is, in a case where two tests are performed on voltage at the set test time interval and a difference between a result from a latter test and a result from a former test is less than or equal to 1 mV, the voltage from the latter test.

8. The method of charge level early warning for a composite battery pack according to claim 3, wherein the lithium thionyl chloride battery used for the tests has a state of charge of 20-100%.

9. The method of charge level early warning for a composite battery pack according to claim 1, wherein the capacitor comprises a conventional capacitor and/or a supercapacitor.

10. The method of charge level early warning for a composite battery pack according to claim 9, wherein each of the composite battery packs used for the tests has the same capacitor.

11. The method of charge level early warning for a composite battery pack according to claim 1, wherein the lithium thionyl chloride battery used for the tests has a state of charge of 20-100%.

12. The method of charge level early warning for a composite battery pack according to claim 11, wherein a method for obtaining the correlation between the state of charge of the lithium thionyl chloride battery and the stable voltage comprises plotting based on data.

13. The method of charge level early warning for a composite battery pack according to claim 11, wherein the maximum output current is measured under a pulse discharge condition;

wherein the pulse discharge is performed at 200-400 mA/1 s; and the maximum output current is measured at two ends of the lithium thionyl chloride battery.

14. The method of charge level early warning for a composite battery pack according to claim 11, wherein the early warning is performed when the stable voltage of the capacitor in the composite battery pack to be subjected to charge level early warning is consecutively less than or equal to the stable voltage corresponding to the set state-of-charge early warning value of the lithium thionyl chloride battery for 10-14 h.

15. The method of charge level early warning for a composite battery pack according to claim 11, wherein in a case where the voltage early warning and the current early warning are performed simultaneously, when either of the voltage early warning and the current early warning reaches its early warning condition, it is determined that the charge level of the composite battery pack reaches the early warning value.

16. The method of charge level early warning for a composite battery pack according to claim 11, which further comprises plotting based on data to obtain the correlation between the state of charge of the lithium thionyl chloride battery and the maximum output current.

17. The method of charge level early warning for a composite battery pack according to claim 1, wherein each of the composite battery packs used for the tests has the same capacitor.

18. The method of charge level early warning for a composite battery pack according to claim 1, wherein the maximum output current is measured under a pulse discharge condition;

wherein the pulse discharge is performed at 200-400 mA/1 s; and the maximum output current is measured at two ends of the lithium thionyl chloride battery.

19. The method of charge level early warning for a composite battery pack according to claim 1, wherein the early warning is performed when the stable voltage of the capacitor in the composite battery pack to be subjected to charge level early warning is consecutively less than or equal to the stable voltage corresponding to the set state-of-charge early warning value of the lithium thionyl chloride battery for 10-14 h.

20. The method of charge level early warning for a composite battery pack according to claim 19, wherein in a case where the voltage early warning and the current early warning are performed simultaneously, when either of the voltage early warning and the current early warning reaches its early warning condition, it is determined that the charge level of the composite battery pack reaches the early warning value.

21. The method of charge level early warning for a composite battery pack according to claim 1, wherein in a case where the voltage early warning and the current early warning are performed simultaneously, when either of the voltage early warning and the current early warning reaches its early warning condition, it is determined that the charge level of the composite battery pack reaches the early warning value.

22. The method of charge level early warning for a composite battery pack according to claim 1, comprising:

performing a voltage test and/or a current test on at least two composite battery packs formed by connecting a lithium thionyl chloride battery with a capacitor in parallel; wherein the lithium thionyl chloride battery used for the tests has a state of charge of 20-100%, and the lithium thionyl chloride battery in each composite battery pack has a different state of charge; each of the composite battery packs used for the tests has the same capacitor;

the voltage test comprises measuring a stable voltage of the capacitor at a test time interval of 1-3 h, and based on the test result, obtaining a correlation between the state of charge of the lithium thionyl chloride battery and the stable voltage;

the current test comprises measuring a maximum output current at two ends of the lithium thionyl chloride battery under 200-400 mA/1 s pulse discharge condition, and based on the test result, obtaining a correlation between the state of charge of the lithium thionyl chloride battery and the maximum output current;

monitoring a composite battery pack to be subjected to charge level early warning, and performing early warning based on voltage, wherein the early warning is performed when the stable voltage of the capacitor in the composite battery pack to be subjected to charge level early warning is less than or equal to the stable voltage corresponding to a set state-of-charge early warning value of the lithium thionyl chloride battery, and/or performing early warning based on current, wherein, under the same pulse discharge condition as the current test, the early warning is performed when the maximum output current of the lithium thionyl chloride battery in the composite battery pack to be subjected to charge level early warning is less than or equal to the maximum output current corresponding to a set state-of-charge early warning value of the lithium thionyl chloride battery;

in a case where the voltage early warning and the current early warning are performed simultaneously, when either of the voltage early warning and the current early warning reaches its early warning condition, it is determined that the charge level of the composite battery pack reaches the early warning value.

23. The method of charge level early warning for a composite battery pack according to claim 1, wherein the capacitor comprises a lithium-ion battery capacitor.

24. The method of charge level early warning for a composite battery pack according to claim 1, which further comprises plotting based on data to obtain the correlation between the state of charge of the lithium thionyl chloride battery and the stable voltage.

25. The method of charge level early warning for a composite battery pack according to claim 1, which further comprises plotting based on data to obtain the correlation between the state of charge of the lithium thionyl chloride battery and the maximum output current.

* * * * *